United States Patent
Hein et al.

(10) Patent No.: US 7,227,913 B1
(45) Date of Patent: Jun. 5, 2007

(54) CLOCK AND DATA RECOVERY CIRCUIT WITHOUT JITTER PEAKING

(75) Inventors: Jerrell P. Hein, Driftwood, TX (US); Michael H. Perrott, Somerville, MA (US)

(73) Assignee: Silicon Laboratories Inc., Austin, TX (US)

( * ) Notice: Subject to any disclaimer, the term of this patent is extended or adjusted under 35 U.S.C. 154(b) by 1070 days.

(21) Appl. No.: 09/888,717

(22) Filed: Jun. 25, 2001

Related U.S. Application Data

(60) Provisional application No. 60/278,784, filed on Mar. 26, 2001.

(51) Int. Cl.
*H03D 3/18* (2006.01)
(52) U.S. Cl. .................................................. 375/327
(58) Field of Classification Search ................ 375/327, 375/371, 373, 376; 327/147, 149, 153, 156, 327/158, 161; 331/25
See application file for complete search history.

(56) References Cited

U.S. PATENT DOCUMENTS

| | | | |
|---|---|---|---|
| 4,647,984 A * | 3/1987 | Suzuki et al. .................. 386/18 |
| 5,036,298 A | 7/1991 | Bulzachelli | |
| 6,118,316 A * | 9/2000 | Tamamura et al. .......... 327/156 |
| 6,178,212 B1 * | 1/2001 | Akashi ........................ 375/355 |
| 6,229,357 B1 * | 5/2001 | Nair et al. .................... 327/115 |
| 6,353,648 B1 * | 3/2002 | Suzuki ......................... 375/376 |
| 6,542,040 B1 * | 4/2003 | Lesea ............................ 331/11 |
| 6,711,227 B1 * | 3/2004 | Kaylani et al. .............. 375/372 |
| 6,959,062 B1 * | 10/2005 | Stubbs ......................... 375/376 |

\* cited by examiner

*Primary Examiner*—Khanh Tran
*Assistant Examiner*—Sam K. Ahn
(74) *Attorney, Agent, or Firm*—Zagorin O'Brien Graham LLP

(57) ABSTRACT

In a clock recovery circuit, the output clock from a voltage controlled oscillator is delayed and then provided to a phase detector circuit that generates a difference signal indicating the phase difference between an incoming data stream and the delayed output clock. A loop filter circuit receives the difference signal and supplies a control signal to the oscillator circuit, which varies the output clock according to the control signal. A delay clock circuit receives a delay control signal derived from the difference signal to determine the output clock delay.

25 Claims, 6 Drawing Sheets

CLOCK AND DATA RECOVERY CIRCUIT WITHOUT JITTER PEAKING

This application claims the benefit under 35 U.S.C. 0 119(e) of U.S. Provisional Application No. 60/278,784, filed Mar. 26, 2001, entitled "Clock and Data Recovery Circuit Without Jitter Peaking," naming Jerrell P. Hein and Michael H. Perrott as inventors.

BACKGROUND OF THE INVENTION

1. Field of the Invention

This invention relates to clock recovery circuits and more particularly to phase locked loops used to recover a clock and data from an input data stream.

2. Description of the Related Art

It is common to transmit data streams with an implied clock. When the data stream is decoded, the clock is extracted from the data and regenerated. The data is then resynchronized to the extracted clock. Traditionally, a phase locked loop (PLL) has been used to perform the clock recovery operation. FIG. 1A shows a block diagram of a traditional PLL configured for a clock and data recovery application. The phase locked loop 100 includes a phase detector 102, which receives the input data signal conveyed on node 104 and also receives the output clock signal conveyed on node 106 from the voltage controlled oscillator (VCO) 108. The phase detector 102 generates an error signal 110, which is a function of the phase difference between the input data signal and the VCO output clock signal. The phase detector 102 may also include additional circuitry to generate the reconstructed data on output node 114.

The loop amplifier and filter block 112 typically includes a gain block 120, an integrator block 122, and a summer block 124, shown in FIG. 1B. The loop amplifier and filter block 112 low-pass filters the output of the phase detector 102 to generate a control signal on node 116 that is provided to the VCO 108. VCO 108 adjusts the output clock signal on node 106 in response to the control signal to track the input data signal.

In data/clock recovery systems, traditional PLLs have two significant drawbacks. First, the stabilizing zero in the loop gain equation produces jitter peaking in the closed loop transfer response. In order to appreciate this issue, a brief description of the frequency response of the traditional PLL is set forth. FIG. 1C, illustrates the linear block diagram of the PLL shown in FIG. 1A. Equation 1 sets forth the closed loop transfer function, G(s), of traditional PLL 100, where $\tau_1$ is the time constant of the explicit zero and $K_1$ is the combined gain of the loop amplifier and filter, the phase detector and the VCO.

$$G(s) = \frac{K_1(1 + \tau_1 s)}{s^2 + K_1 \tau_1 s + K_1} \quad \text{(Eq. 1)}$$

FIG. 2 shows a graph of the frequency response of the closed loop transfer function. As can be seen in the graph, the magnitude of the transfer function is fairly constant at low frequency, and increases slightly for a band of frequencies labeled 200, where the transfer function exceeds unity and results in jitter peaking.

The magnitude of that peaking is very critical for many applications. For example, the Synchronous Optical Network (SONET) standard limits the acceptable peaking to 0.1 dB. If allowed to exceed this limit, frequency components of input data jitter which fall within this peaking region are actually amplified by the PLL. If several such PLLs are coupled sequentially, the jitter may be amplified to a degree which severely compromises the ability to meet jitter tolerances, or even to correctly recover data.

A second problem characteristic of traditional PLLs is that the jitter tolerance and the jitter transfer characteristic are both tied to the same circuit parameter (gain $K_1$) and cannot be independently optimized.

A solution to the two problems described above was proposed in U.S. Pat. No. 5,036,298 to Bulzachelli. Unlike the traditional PLL system shown in FIG. 1, the system shown in FIG. 3 delays the incoming data on node 303 by an amount determined by the control voltage on node 305. Note that the incoming data is regenerated by additional logic in phase detector 309 and is retimed to be synchronous with the output clock from VCO 311 on node 312. It is desirable for the system shown in FIG. 3 that the delay provided be a well controlled delay with respect to voltage, independent of the input data pattern. That can be difficult for high speed applications whose circuits do not completely reach a static condition between input transitions.

Therefore, it would be desirable to solve the jitter peaking problem for high speed applications while avoiding the data pattern dependencies associated with prior art PLL structures.

SUMMARY OF THE INVENTION

Accordingly, the invention provides a delay circuit that operates on the VCO output clock instead of the input data, thereby eliminating any delay versus input data pattern issue.

In one embodiment a clock recovery circuit is provides that includes a phase detector circuit that generates a difference signal indicating a phase difference between an incoming data stream and a delayed clock signal. A loop filter circuit receives the difference signal and supplies a filtered output as a control signal to an oscillator circuit as in a conventional PLL circuit. The oscillator circuit responds to the control signal to generate an output clock signal that varies according to the control signal to track the input data signal. A delay clock circuit receives a delay control signal derived from the difference signal and outputs the output clock signal delayed according to the delay control signal, as the delayed clock signal. In one embodiment the delay control signal is the same control signal supplied to the VCO.

In another embodiment, a method is provided for recovering a clock signal from an incoming data stream. The method includes determining a phase difference between an input data stream and a delayed clock signal in a phase detector and generating a difference signal indicative thereof. A control signal is generated from the difference signal to control an oscillator, which generates an output clock that varies according to the control signal. A delayed version of the output clock is created in a delay circuit with the delay being dependent upon a delay control signal derived from the difference signal. That delayed version is supplied to the phase detector as the delayed clock signal.

In order to provide recovered data that is retimed to the output clock rather than the delayed clock, a FIFO memory may be used in which the delayed clock signal is used as the FIFO write clock and the output clock is used as the FIFO read clock. Alternatively, a series of successively coupled registers clocked by intermediate signals from the delay clock circuit can be used to gradually shift the data from the delayed clock to the output clock.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 4A:
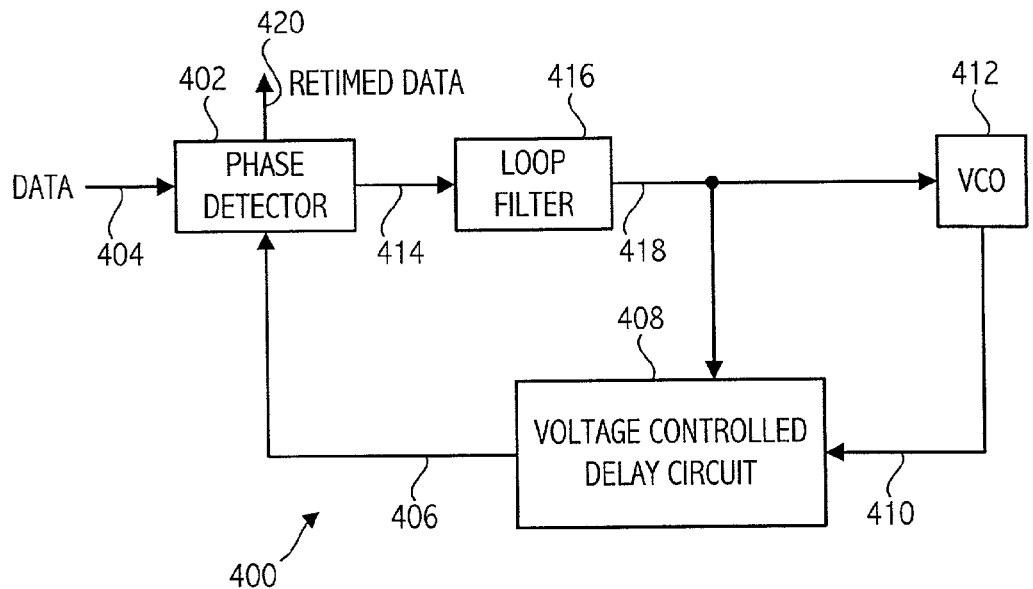
FIG. 4A depicts an embodiment of a clock recovery circuit according to the present invention.

Referring to FIG. 4A, a block diagram of a phase locked loop (PLL) configured for a clock and data recovery application according to the present invention is shown. Rather than delaying the data, the phase locked loop 400 delays the feedback clock supplied to phase detector 402. More specifically, phase detector 402 receives the input data signal conveyed on node 404 and the delayed clock signal conveyed on node 406 from the voltage controlled delay circuit 408. Voltage controlled delay circuit 408 receives the output clock on node 410 from voltage controlled oscillator (VCO) 412. The phase detector 402 generates an error signal on node 414, which is a function of the phase difference between the input data signal and the delayed clock signal. The loop filter 416 functions conventionally as a low pass filter for the error signal 414 and generates the control signal on node 418, which causes VCO 412 to adjust the output clock on node 410 to track the input data signal. The control signal 418 is used both to adjust the phase of the VCO output clock on node 410 as well as control the amount that the output clock is delayed in delay circuit 408.

The phase detector 402 may also include additional circuitry known in the art to generate the reconstructed data on output node 420 that is retimed to the delay clock. Alternatively, the additional circuitry may be outside the phase detector. In a typical implementation, once the clock input to the phase detector (signal 406) and the input data are properly aligned by the phase detector, the clock 406 is used to strobe the input data into a flip-flop, thus generating retimed data synchronized to the delayed clock signal 406.

Figure 4B:
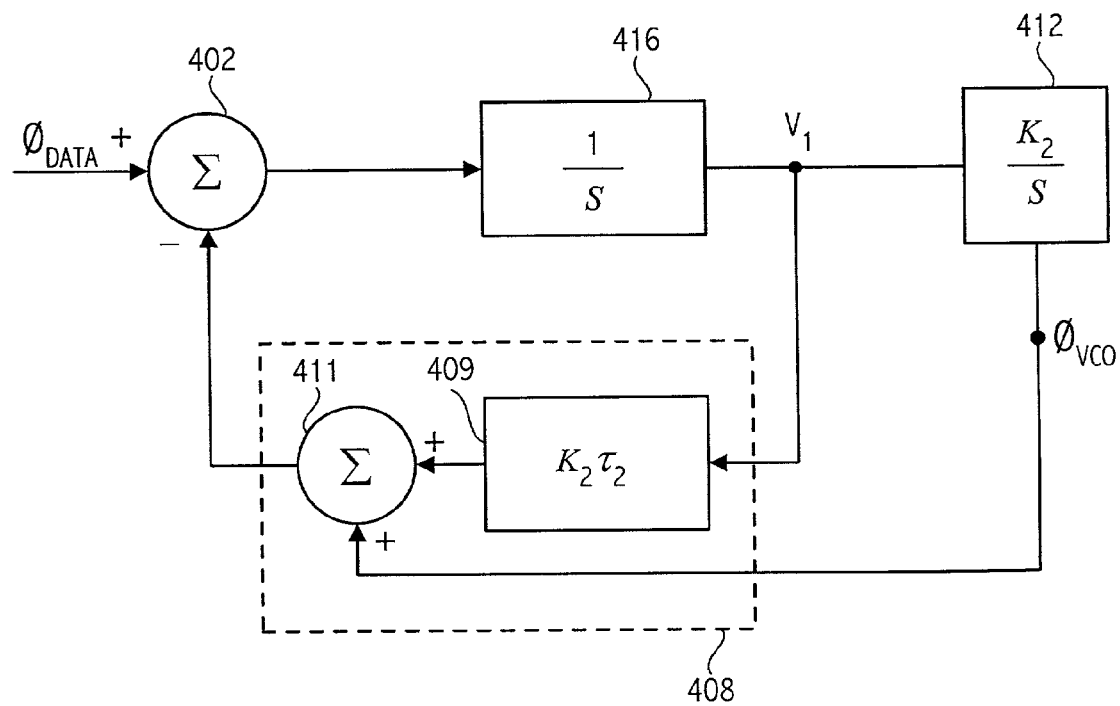
FIG. 4B depicts a linear block diagram for the clock recovery circuit illustrated in FIG. 4A.

Referring to FIG. 4B a linearized block diagram illustrates the transfer function associated with the PLL shown in FIG. 4A. The blocks in FIG. 4B have the same reference numbers as the blocks shown in FIG. 4A to indicate that their correspondence. From FIG. 4B, it can be shown that:

$$\phi_{VCO} = \frac{K_2}{s} V_1 \qquad \text{(Eq. 2)}$$

$$V_1 = \frac{1}{s}[\phi_{DATA} - (\phi_{VCO} + K_2\tau_2 V_1)] \qquad \text{(Eq. 3)}$$

The closed loop transfer function G(s) is:

$$G(s) = \frac{\phi_{VCO}}{\phi_{DATA}} = \frac{K_2}{s^2 + K_2\tau_2 s + K_2} \qquad \text{(Eq. 4)}$$

In the above equation $K_2$ represents the VCO gain in MHz/V and $K_2\tau_2$ is defined as the phase shift in the delay line per volt at $V_1$ (in units of S/V).

Figure 1A:
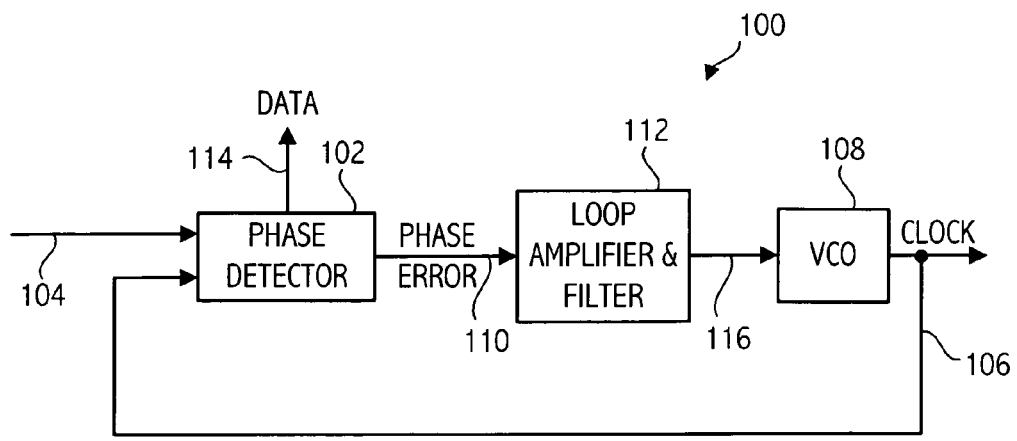
FIG. 1A depicts a prior art clock and data recovery circuit.
Figure 1B:
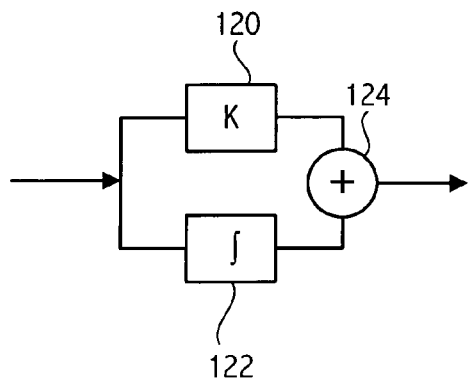
FIG. 1B depicts additional details on the loop filter shown in FIG. 1A.
Figure 1C:
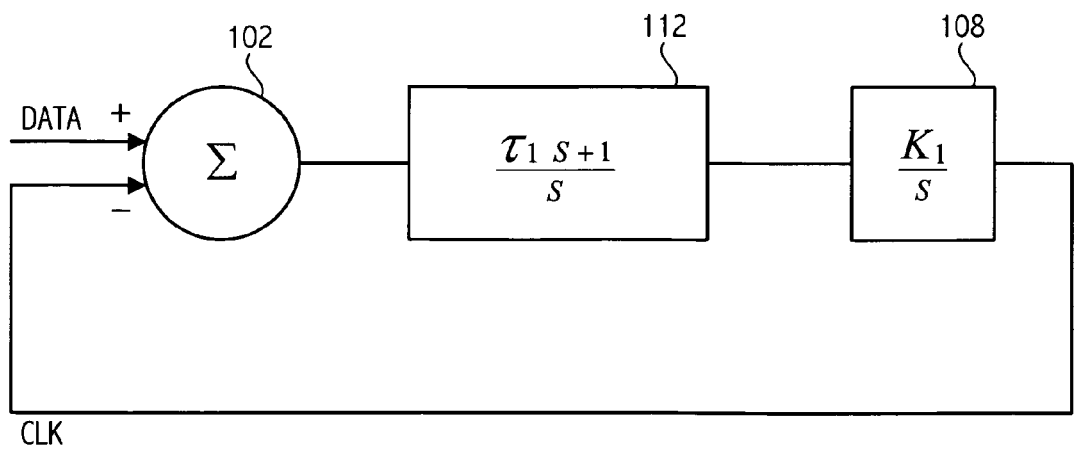
FIG. 1C shows a linear block diagram for the traditional clock and data recovery circuit shown in FIG. 1A.
Figure 2:
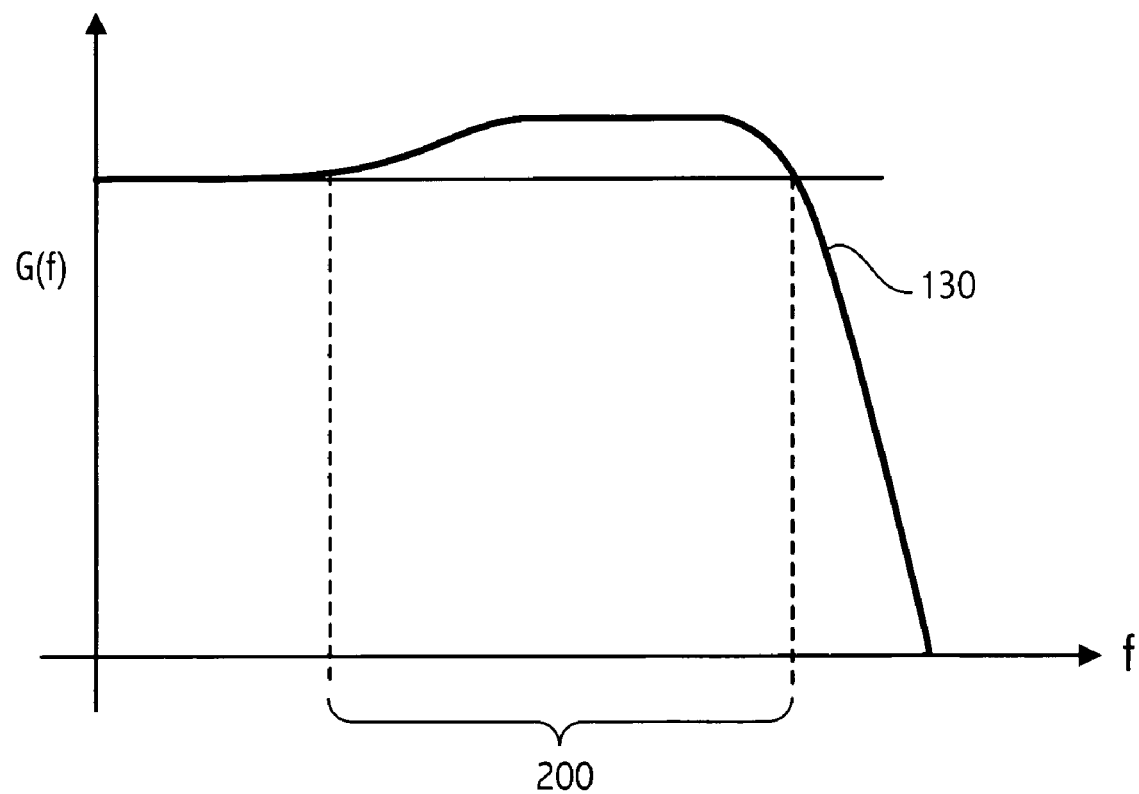
FIG. 2 is a graph of the frequency response of this closed loop transfer function G(s) of the traditional PLL circuit shown in FIG. 1A.
Figure 3:
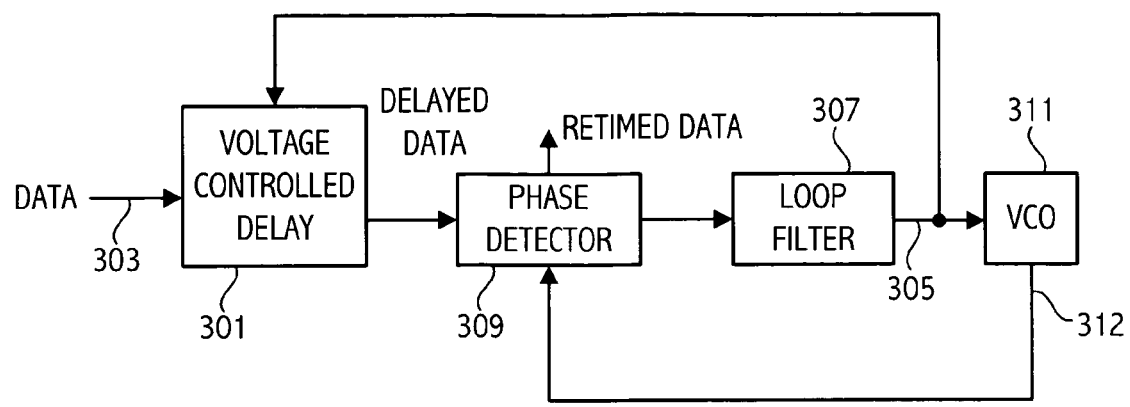
FIG. 3 depicts a prior art clock and data recovery circuit that overcomes the jitter peaking problem found in the PLL system shown in FIG. 1A.

Delaying the clock allows the zero in the closed loop response to be eliminated and thus eliminates the jitter peaking problem illustrated in FIG. 2. Further, because the delay is accomplished by delaying the clock rather than the data, the delay is data pattern independent.

Figure 5:
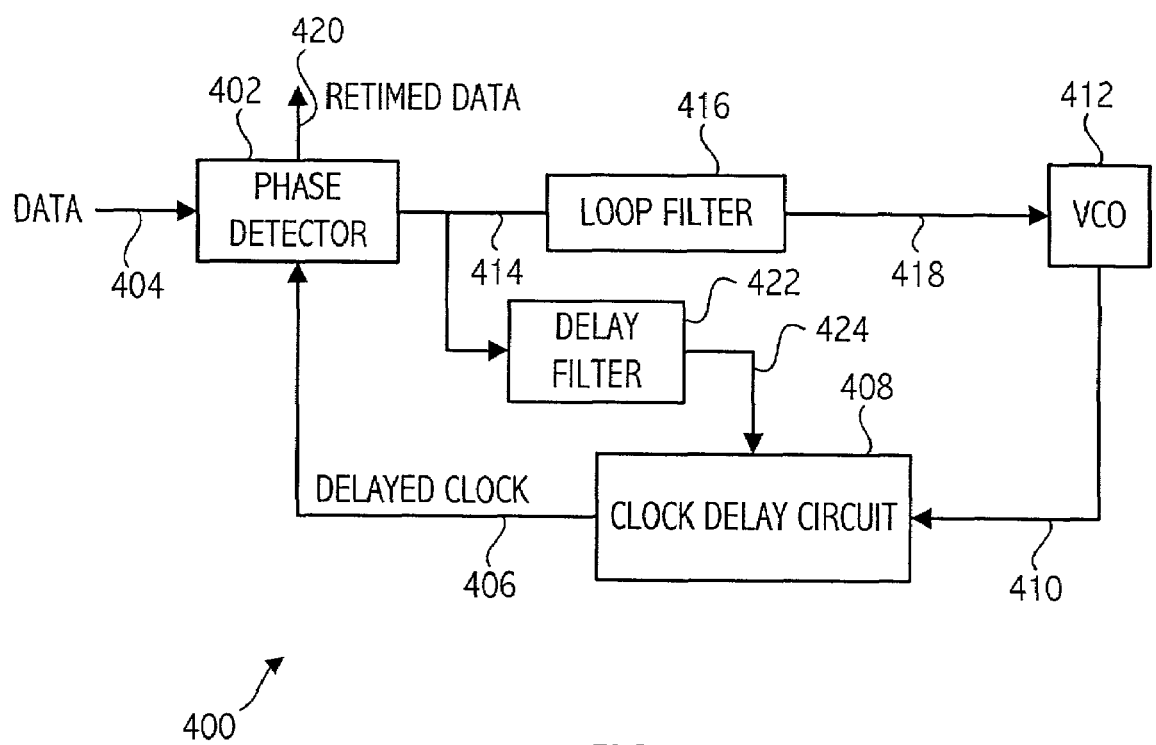
FIG. 5 depicts another embodiment of a clock recovery circuit according to the present invention.

Another embodiment of the invention is illustrated in FIG. 5. Rather than use the same filter to generate the control voltage for VCO 412 and clock delay circuit 408, a separate filter 422 is used to generate the delay control signal on node 424.

Referring FIGS. 4 and 5, note that the retimed data provided on node 420 is retimed to the delay clock supplied on node 406 (since that is the only clock received in that block), rather that the output clock from VCO 412. However, the data should be retimed to the output clock from the VCO. Various approaches described further herein can be used to accomplish that task.

Figure 6:
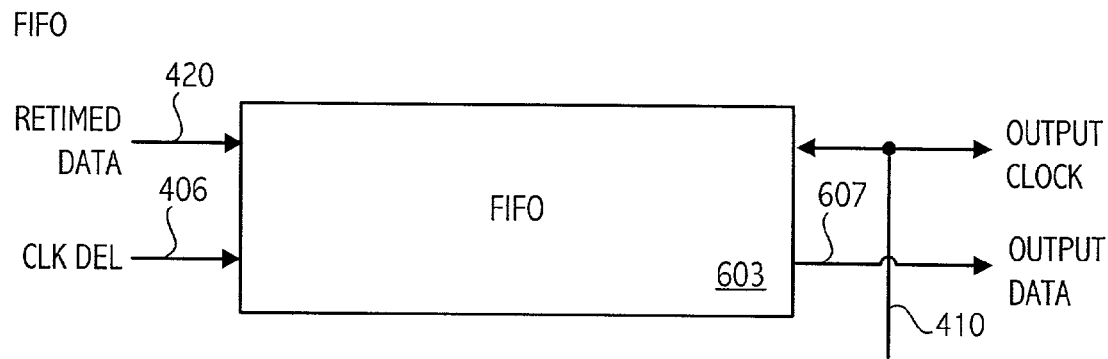
FIG. 6 depicts one embodiment for retiming input data according to the present invention.

FIG. 6 shows one embodiment to retime the recovered data from the delayed clock to the VCO output clock. Assume the data is recovered in a conventional manner using the delayed clock 406, as described previously. The data, synchronized to the delay clock, is provided on node 420 to first in first out (FIFO) buffers 603. The data is written into the FIFO with the delayed clock supplied from node 406. The VCO output clock on node 410 is supplied to the FIFO as the read clock and the data is read out on node 607. Thus, in order to retime the data, the data is written into the FIFO using the delayed clock as the FIFO write clock and read out of the FIFO using the VCO output clock as the FIFO read clock.

Figure 7:
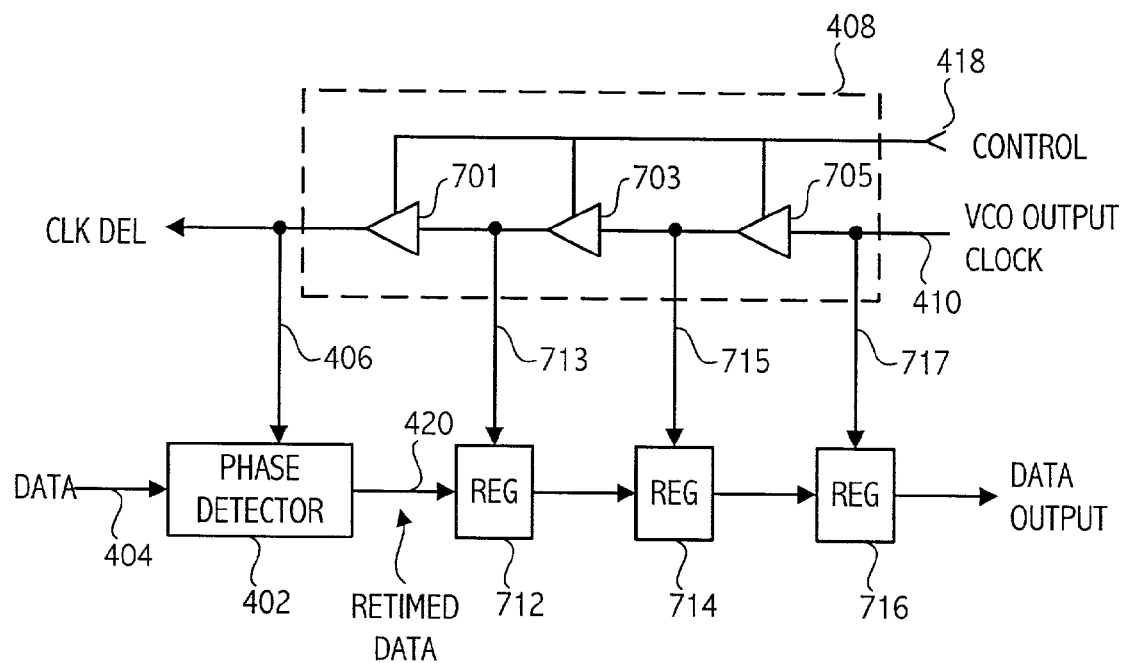
FIG. 7 depicts another embodiment for retiming input data according to the present invention.

FIG. 7 illustrates another embodiment for retiming the data from the delayed clock to the VCO output clock. An exemplary voltage controlled delay circuit 408 includes a plurality of stages 701, 703 and 705. Loop filter 416 (see FIG. 4) supplies the voltage control signal on node 418 to control the propagation of the VCO output clock through the delay circuit 408. As described previously, phase detector 402 receives the delay clock supplied on node 406. A plurality of registers 712, 714, and 716 are successively coupled and clocked by respective intermediate outputs from the voltage controlled delay circuit 408. In particular, the phase detector 402 supplies the data retimed to the delayed clock on node 420 to register 712, which is clocked by intermediate output signal 713. Register 714, which receives data from register 712, is clocked by intermediate delay clock output 715. Data is moved successively in each register stage to a less delayed clock that is closer to the actual VCO output clock. Finally, register 716 is clocked by the VCO output clock supplied on node 410. The data in register 716 is thus synchronized to the VCO output clock rather than the delayed clock. Note that the number of delay stages and the number of registers used is exemplary only. The delay from one stage to the next should be less than one period of the output clock.

The need to retime the data to the VCO output clock rather than the delayed clock adds some complexity over the prior art where the data is provided retimed to the VCO output clock initially. Note, however, that the added complexity is in digital logic in an architecture that eliminates an analog problem that can result in increased output clock jitter.

The description of the invention set forth herein is illustrative, and is not intended to limit the scope of the invention as set forth in the following claims. For example, while the oscillator and the delay circuit have been described as voltage controlled, current controlled circuits could also be used. In addition a variety of storage elements (e.g., latches, flip-flops, etc.) could be used for FIFO 603 and registers 712–716. Other variations and modifications of the embodiments disclosed herein, may be made based on the description set forth herein, without departing from the scope and spirit of the invention as set forth in the following claims.

What is claimed is:

1. A clock recovery circuit comprising:
   a phase detector circuit coupled to generate a difference signal indicating a phase difference between an incoming data stream and a delayed clock signal;
   an oscillator circuit responsive to a control signal derived from the difference signal to generate an output clock signal variable according to the control signal; and
   a clock delay circuit coupled to receive a delay control signal derived from the difference signal and to receive the output clock signal, the clock delay circuit coupled to provide as the delayed clock signal the output clock signal delayed according to the delay control signal.

2. The clock recovery circuit as recited in claim 1 further comprising a loop filter circuit coupled to receive the difference signal and supply a filtered output as the control signal.

3. The clock recovery circuit as recited in claim 1 wherein the control signal for the oscillator circuit is used as the delay control signal.

4. The clock recovery circuit as recited in claim 1 further comprising a delay control filter circuit coupled to receive the difference signal and generate the delay control signal based thereon.

5. The clock recovery circuit as recited in claim 1 wherein the clock delay circuit is a voltage controlled delay circuit.

6. The clock recovery circuit as recited in claim 1 wherein the clock delay circuit comprises multiple stages.

7. The clock recovery circuit as recited in claim 6 wherein a delay period from one stage to a next stage in the clock delay circuit is less than one period of the output clock signal.

8. The clock recovery circuit as recited in claim 1 further comprising a data recovery circuit.

9. The clock recovery circuit as recited in claim 1 wherein the oscillator circuit is a voltage controlled oscillator.

10. The clock recovery circuit as recited in claim 1 further comprising means for retiming the incoming data signal from the delayed clock signal to the output clock signal.

11. The clock recovery circuit as recited in claim 1 further comprising:
    a first in first out (FIFO) memory coupled to write data into the FIFO memory with the delayed clock signal and to read data out of the FIFO memory with the output clock signal, thereby retiming data to the output clock signal.

12. The clock recovery circuit as recited in claim 1 having a closed loop response without an explicit zero.

13. A clock recovery circuit comprising:
    a phase detector circuit coupled to generate a difference signal indicating a phase difference between an incoming data stream and a delayed clock signal;
    an oscillator circuit responsive to a control signal derived from the difference signal to generate an output clock signal variable according to the control signal;
    a clock delay circuit coupled to receive a delay control signal derived from the difference signal and to receive the output clock signal, the clock delay circuit coupled to provide as the delayed clock signal the output clock signal delayed according to the delay control signal;
    a plurality of serially coupled registers, including at least a first regiser and a last register and wherein the first register is coupled to receive data synchronized to the delayed clock signal and is further coupled to receive a clock signal from the clock delay circuit that is less delayed than the delayed clock signal;
    wherein the clock delay circuit comprises multiple stages;
    wherein a delay period from one stage to a next stage in the clock delay circuit is less than one period of the output clock signal;
    and wherein the last register is coupled to the output clock signal and to receive data from a previous one of the plurality of serially coupled registers, thereby providing out of the last register data retimed to the output clock signal.

14. The clock recovery circuit as recited in claim 13 further comprising at least one intermediate register serially coupled between the first and last registers, each of the plurality of serially coupled registers receiving a successively less delayed clock signal.

15. A method of recovering a clock signal from an input data stream comprising:
    determining a phase difference between the input data stream and a delayed clock signal and generating a difference signal indicative thereof;
    generating a control signal from the difference signal to control an oscillator;
    generating in the oscillator an output clock signal that varies according to the control signal; and
    receiving the output clock signal in a delay circuit and generating the delayed clock signal from the output clock signal according to a delay control signal derived from the difference signal.

16. The method as recited in claim 15 further comprising using the control signal for the oscillator as the delay control signal.

17. The method as recited in claim 15 further comprising generating the delay control signal in a delay filter circuit separate from the control signal.

18. The method as recited in claim 15 further comprising providing input data from the input data stream that is synchronized to the delayed clock signal and retiming the input data from the delayed clock signal to the output clock signal.

19. The method as recited in claim 18 further comprising generating the delayed clock signal in a plurality of stages in the delay circuit and wherein a delay period from one stage to a next stage in the delay circuit is less than one period of the output clock signal.

20. The method as recited in claim 19 wherein retiming the input data further comprises:
   providing data synchronized to the delayed clock signal to a first register of a plurality of successively coupled registers;
   clocking the first register with a clock signal from the delay circuit that is less delayed than the delayed clock signal;
   supplying a last register of the plurality of successively coupled registers with data from a previous register of the plurality of successively coupled registers; and
   clocking the last register of the plurality of successively coupled registers with the output clock signal to thereby retime data from the delayed clock signal to the output clock signal.

21. The method as recited in claim 20 wherein the previous register is the first register.

22. The method as recited in claim 18 further comprising:
   writing data synchronized to the delayed clock signal into a memory; and
   reading data from the memory with the output clock signal to thereby retime the data from the delayed clock signal to the output clock signal.

23. The method as recited in claim 22 wherein the memory is a first in first out (FIFO) memory.

24. An apparatus comprising:
   means for detecting a phase difference between an incoming data stream and a delayed clock signal and generating a difference signal indicative thereof;
   means for generating a control signal according to the difference signal;
   means for generating a clock signal that varies according to the control signal; and
   means for generating the delayed clock signal from the clock signal according to a delay control signal derived from the difference signal.

25. The apparatus as recited in claim 24 further comprising means for retiming data from the delayed clock signal to the clock signal.

* * * * *

UNITED STATES PATENT AND TRADEMARK OFFICE
CERTIFICATE OF CORRECTION

| | | |
|---|---|---|
| PATENT NO. | : 7,227,913 B1 | Page 1 of 1 |
| APPLICATION NO. | : 09/888717 | |
| DATED | : June 5, 2007 | |
| INVENTOR(S) | : Jerrell P. Hein and Michael H. Perrott | |

It is certified that error appears in the above-identified patent and that said Letters Patent is hereby corrected as shown below:

Col. 6, line 26, please replace "a first regiser and" with --a first register and--

Signed and Sealed this

Seventh Day of August, 2007

JON W. DUDAS
*Director of the United States Patent and Trademark Office*